United States Patent
Ikarashi et al.

(10) Patent No.: US 8,659,000 B2
(45) Date of Patent: Feb. 25, 2014

(54) AMORPHOUS SEMIICONDUCTOR LAYER MEMORY DEVICE

(75) Inventors: Minoru Ikarashi, Kanagawa (JP); Katsuhisa Aratani, Aichi (JP)

(73) Assignee: Sony Corporation, Tokyo (JP)

( * ) Notice: Subject to any disclaimer, the term of this patent is extended or adjusted under 35 U.S.C. 154(b) by 294 days.

(21) Appl. No.: 13/197,805

(22) Filed: Aug. 4, 2011

(65) Prior Publication Data

US 2012/0037872 A1 Feb. 16, 2012

(30) Foreign Application Priority Data

Aug. 11, 2010 (JP) .................... 2010-180490

(51) Int. Cl.
*H01L 45/00* (2006.01)
*H01L 29/00* (2006.01)

(52) U.S. Cl.
USPC ............................ 257/4; 257/2; 257/E45.002

(58) Field of Classification Search
CPC ... H01L 27/2436; H01L 45/14; H01L 45/141; H01L 45/143; H01L 45/144; G11C 2013/009; G11C 2213/53
USPC .................................. 257/625, 2, 4, E45.002
See application file for complete search history.

(56) References Cited

U.S. PATENT DOCUMENTS 5,315,131 A * 5/1994 Kishimoto et al. ............. 257/57

OTHER PUBLICATIONS

S. Hudgens and B. Johnson; Overview of Phase-Change Chalcogenide Nonvolatile Memory Technology; MRS Bulletin; p. 829; Nov. 2004.

* cited by examiner

*Primary Examiner* — Jerome Jackson, Jr.
*Assistant Examiner* — Paul Budd
(74) *Attorney, Agent, or Firm* — Dentons US LLP

(57) ABSTRACT

A memory device includes: an amorphous semiconductor layer of a first conduction type; a solid electrolyte layer containing movable ions and provided in contact with a part of one of faces of the amorphous semiconductor layer; a first electrode electrically connected to the amorphous semiconductor layer via the solid electrolyte layer; a second electrode electrically connected to one of the faces of the amorphous semiconductor layer; and a third electrode provided over the other face of the amorphous semiconductor layer with an insulating layer therebetween. At the time of application of voltage to the third electrode, at least a part of the amorphous semiconductor layer reversibly changes to a second conduction type.

10 Claims, 8 Drawing Sheets

AMORPHOUS SEMIICONDUCTOR LAYER MEMORY DEVICE

BACKGROUND

The present disclosure relates to a memory device to/from which data is written/erased by a change in a conduction type of an amorphous semiconductor layer and, more particularly, to a memory device having an MISFET (Metal Insulator Semiconductor Field Effect Transistor) structure.

With the dramatic spread of small devices for individuals such as information communication devices and, particularly, portable terminals, elements such as memories and logics constructing the devices are demanded to achieve higher performances such as higher integration, higher speed, and lower power. A nonvolatile memory such as a semiconductor flash memory or an FeRAM (Ferroelectric Random Access Memory) is being actively studied and developed for further higher performances.

In recent years, one of nonvolatile memories which are regarded as promising ones is a phase-change memory (refer to, for example, S. Hudgens, et al., "Overview of Phase-Change Chalcogenide Nonvolatile Memory Technology", MRS BULLETIN NOVEMBER 2004, p. 829). A phase-change memory has a chalcogenide semiconductor layer between two electrodes one of which is connected to a selection diode or a selection transistor, and a part of the chalcogenide semiconductor layer is in contact with one of the electrodes. In the interface with the electrode, the chalcogenide semiconductor layer changes from a crystal state of low electric resistance to an amorphous state of high electric resistance or from the amorphous state to the crystal state by generation of Joule heat. When the crystal state is set as "1" and the amorphous state is set as "0", by reading the change in the resistance state, "1" and "0" can be discriminated from each other. A resistance value histogram corresponding to the state of "1" and that corresponding to the state of "0" are a resistance separation characteristic which is an important characteristic to increase memory performance.

An amorphous chalcogenide used for a phase-change memory is glass containing a chalcogen element (S, Se, Te) and its representative one is $Ge_2Sb_2Te_5$ or the like. Glass and an amorphous material are almost equivalent terms. Both of them are solids but do not have the long-range order of a crystal structure unlike liquids. A material having no clear glass-transition point is defined here as an amorphous material.

A phase transition between the amorphous state and the crystal state in the chalcogenide semiconductor layer always accompanies latent heat and is therefore classified as a so-called phase transition of the first kind. The phase transition of the first kind defined here relates to the case where the first order differential (the following expression (1)) of the Gibbs free energy G is discontinuous. In this case, discontinuity occurs in volume or enthalpy. In the expression (1), p denotes pressure of a system, and T denotes absolute temperature of the system. Latent heat necessary for the phase transition of the first kind is equal to discontinuity in enthalpy and, in a state where the pressure or temperature of the system is constant, endothermic reaction or exothermic reaction occurs.

$$\left(\frac{\partial G}{\partial P}\right)_T \text{ OR } \left(\frac{\partial G}{\partial T}\right)_P \quad (1)$$

A chalconide semiconductor is used as a channel layer of a TFT (Thin Film Transistor) in the past. Particularly, a thin film transistor using Te (tellurium) has a relatively good characteristic including hall mobility of about 250 $cm^2/Vs$. However, there are issues such as toxicity of Te, limitation only to a p-type thin film transistor, and magnitude of leak current. With the advent of an amorphous hydrogenated silicon semiconductor, the chalcogenide semiconductor is not used for the channel layer.

SUMMARY

In a phase-change memory based on such phase transition of the first kind, when the chalcogenide semiconductor layer changes from the crystal state to the amorphous state, almost half of input Joule heat is absorbed as latent heat. In other words, in a phase-change memory as a related art, the Joule heat higher than the latent heat has to be generated, and it is difficult to largely reduce power consumption in principle.

In the phase transition of the first kind, temperature rise exceeding the melting point of the chalcogenide semiconductor is necessary. Due to the temperature rise, the material in the periphery of the chalcogenide semiconductor layer is thermally damaged very severely.

Further, the phase transition of the first kind accompanies a large volume change of about a few % corresponding to reconstruction of the crystal state—the amorphous state before and after the phase transition, so that a film peeling phenomenon due to the difference between the thermal expansion coefficient of the chalcogenide semiconductor layer and the thermal expansion coefficient of the electrode occurs. Such temperature rise and volume change restrict the number of rewriting times and reliability.

In the case of using the chalcogenide semiconductor for the phase change memory, most often, it is used as a single-layer film. There is also a case such that, as described above, the chalcogenide semiconductor is used for the channel layer of a thin film transistor. However, for example, even in a complicated MISFET structure, as long as the resistance change caused by the phase transition of the first kind is used as a principle, occurrence of issues such as power consumption and reliability is not avoided, and a realistic advantage is not obtained.

It is therefore desirable to provide a nonvolatile memory device achieving low power consumption and high reliability.

A memory device according to an embodiment of the disclosure includes: an amorphous semiconductor layer of a first conduction type; a solid electrolyte layer containing movable ions and provided in contact with a part of one of faces of the amorphous semiconductor layer; a first electrode electrically connected to the amorphous semiconductor layer via the solid electrolyte layer; a second electrode electrically connected to one of the faces of the amorphous semiconductor layer; and a third electrode provided over the other face of the amorphous semiconductor layer with an insulating layer therebetween. At the time of application of voltage to the third electrode, at least a part of the amorphous semiconductor layer reversibly changes to a second conduction type.

In the memory device, by application of predetermined voltage to the third electrode, an accumulation layer is formed on the surface of the amorphous semiconductor layer, and movable ions move from the solid electrolyte layer to the amorphous semiconductor layer. It changes the conduction type of a part of the amorphous semiconductor layer, a pn junction is formed, and a resistance value between the first and second electrodes changes. By the change in the resistance value, data is written/erased. By adjusting the magnitude and time of the voltage applied to the first and second electrodes, the position of the pn junction formed in the amorphous semiconductor layer is adjusted, and the magnitude of the resistance value between the first and second electrodes is selected. In other words, multivalue recording is achieved.

In the memory device as an embodiment of the disclosure, the conduction type of the amorphous semiconductor layer is changed by making movable ions move between the solid electrolyte layer and the amorphous semiconductor layer, so that data is written/erased and those states are retained. The change in the conduction type in the amorphous state does not accompany release/absorption of latent heat and a volume change and is carried out by the phase transition of the second kind which does not need a temperature rise exceeding the melting point of the amorphous semiconductor layer. Therefore, power consumption is reduced, and the reliability improves.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENTS

Figure 1:
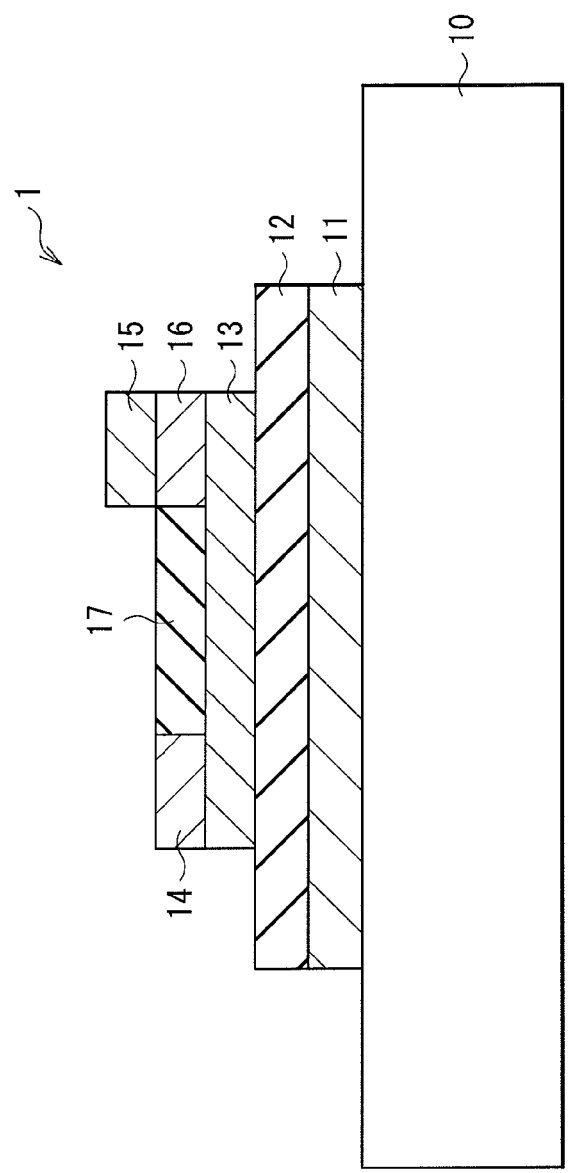
FIG. 1 is a cross section illustrating the configuration of a memory device according to an embodiment of the present disclosure.

Embodiments of the present disclosure will be described in detail below with reference to the drawings. The description will be given in the following order.
1. Embodiment
   Memory device having MISFET structure
2. Modification
   Memory device having heat barrier layer Embodiment FIG. 1 illustrates a sectional configuration of a memory device 1 according to an embodiment of the present disclosure. The memory device 1 has an electrode 11 (third electrode) on a substrate 10, and an amorphous semiconductor layer 13 is provided over the electrode 11 via an insulating layer 12. An electrode 14 (second electrode) and an electrode 15 (first electrode) are provided on/over the surface of the amorphous semiconductor layer 13. A solid electrolyte layer 16 is provided between the electrode 15 and the amorphous semiconductor layer 13. An insulating layer 17 is provided between the electrode 14 on the amorphous semiconductor layer 13 and the electrode 15. In other words, the memory device 1 has an MISFET structure using the electrode 11 as a gate electrode, the electrode 14 as a source electrode, and the electrode 15 as a drain electrode.

The substrate 10 is made of, for example, semiconductor such as silicon. The insulating layers 12 and 17 are made of, for example, silicon dioxide ($SiO_2$).

The amorphous semiconductor layer 13 functions as a channel part in which carriers flow between the electrodes 14 and 15. The amorphous semiconductor layer 13 has a conduction type (first conduction type) which is the n type or the p type in the initial state. At the time of application of voltage to the electrode 11, movable ions move from the solid electrolyte layer 16, so that the conduction type of at least a part of the amorphous semiconductor layer 13 changes reversibly to the second conduction type. Specifically, while forming an accumulation layer, the movable ions move from the solid electrolyte layer 16 to the amorphous semiconductor layer 13 or from the amorphous semiconductor layer 13 to the solid electrolyte layer 16, the conduction type of at least a part of the amorphous semiconductor layer 13 changes from the n type to the p type or from the p type to the n type. It changes the resistance state (resistance value) between the electrodes 14 and 15, data is written/erased, and the state is retained.

In the embodiment, by adjusting time and magnitude of the voltage applied across the electrodes 14 and 15 as will be described later to change the position of a pn junction formed in the amorphous semiconductor layer 13, the value of resistance between the electrodes 14 and 15 is controlled.

As such an amorphous semiconductor layer 13, it is preferable to use chalcogenide semiconductor containing a chalcogen element such as S, Se, or Te or an alloy of the chalcogen element.

Figure 2:
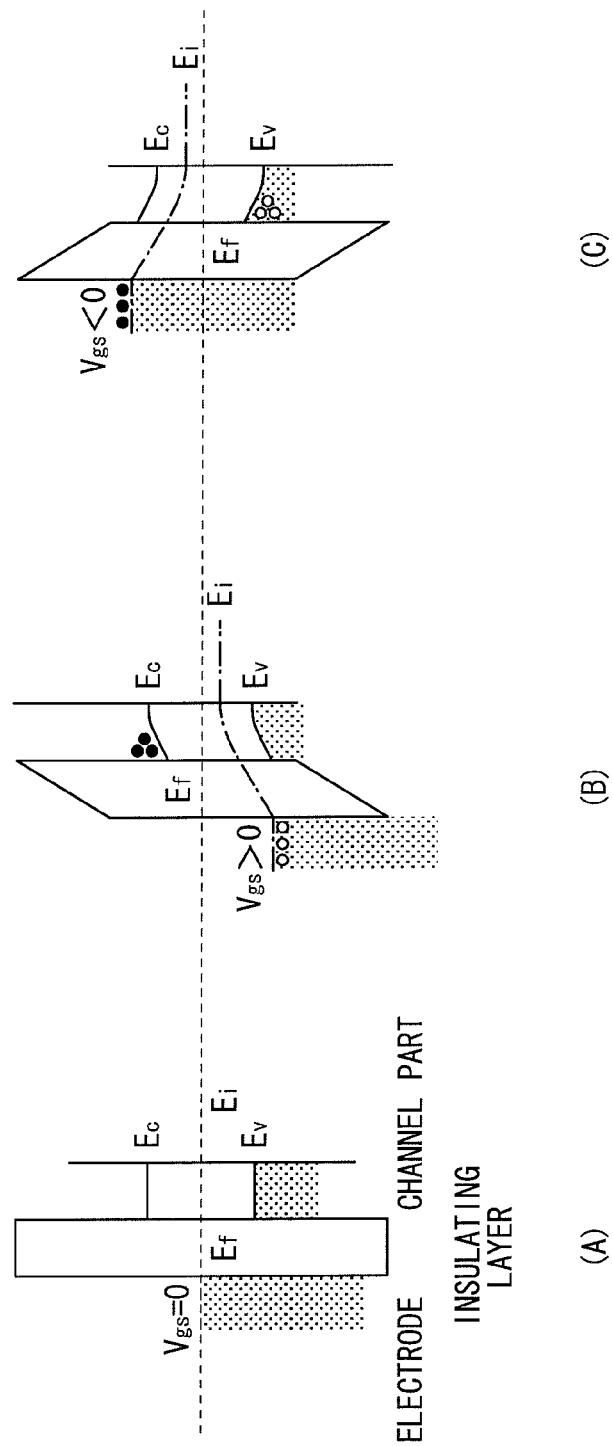
FIG. 2 is an energy band conceptual diagram of a channel part when voltage is applied to an electrode.

The conduction type of the amorphous semiconductor layer 13 changes according to the polarity of the voltage applied to the electrode 11. (A) to (C) of FIG. 2 are conceptual diagrams of the energy band of a channel part in the case of applying voltage to an electrode of a thin film transistor. Electrons or holes are accumulated on the surface of the channel part in accordance with the polarity of voltage $V_{gs}$ applied to the electrode, and the energy band in the surface of the channel part is bent by the voltage. The phenomenon is so-called band bending. The state where the conduction type of the channel part is inverted is called an inversion state, and a state where the band bending reaches the limit and a depletion layer does not expand further is called a strong inversion state. In the strong inversion state, an enormous number of carriers are generated. In the memory device 1, by using the concept of the band bending, the phase shift of the second kind which will be described later occurs in the amorphous semiconductor layer 13.

The solid electrolyte layer 16 provided between the amorphous semiconductor layer 13 and the electrode 15 has the function of supplying positive or negative movable ions to the amorphous semiconductor layer 13 or receiving movable ions from the amorphous semiconductor layer 13. Preferably, the solid electrolyte layer 16 has proper electric conduction property and uses a high-strength high-corrosion-resistance material. For example, a metal glass or metal amorphous material as an alloy whose metal element is a main component is desirable. Particularly, Zr-based metal glass and ZrCuAl-based metal glass have relatively high viscosity and are suitable to finely control a supply amount of movable ions to the amorphous semiconductor layer 13. To facilitate movement of the movable ions to the amorphous semiconductor layer 13, preferably, the property of the solid electrolyte layer 16 and that of the amorphous semiconductor layer 13 as viscous fluids are close to each other. Concretely, in mathematical expression (2) showing a temperature characteristic which determines viscosity η, preferably, activation energy Ea of both of the solid electrolyte layer 16 and the amorphous semiconductor layer 13 is equal to or larger than 2 eV. In the expression (2), η0 denotes proportional constant, $k_B$ denotes Boltzmann constant, and T denotes absolute temperature.

$$\eta = \eta_0 \exp\left(\frac{E_a}{k_B T}\right) \quad (2)$$

The movable ion is, preferably, a monoatomic ion whose radius is small enough to pass through the lattice of the amorphous semiconductor layer 13. For example, in the case of using the amorphous semiconductor layer 13 of the p-type, preferably, the solid electrolyte layer 16 contains any of a monovalent positive ion $H^+$, $Li^+$ (hydron containing $D^+$ and $T^+$), $Na^+$, $K^+$, $Ag^+$, $Cu^+$, $Hg^+$, $Ti^+$, $Rb^+$, or $Cs^+$, a bivalent positive ion $Mg^{2+}$, $Ca^{2+}$, $Sr^{2+}$, $Ba^{2+}$, $Cd^{2+}$, $Ni^{2+}$, $Zn^{2+}$, $Cu^{2+}$, $Hg^{2+}$, $Fe^{2+}$, $Co^{2+}$, $Sn^{2+}$, $Pb^{2+}$, or $Mn^{2+}$, a trivalent positive ion $Al^{3+}$, $Fe^{3+}$, or $Cr^{3+}$, a tetravalent positive ion $Sn^{4+}$, and the like. For example, in the case of using the amorphous semiconductor layer 13 of the n-type, it is preferable to contain any of a monovalent negative ion $H^-$ (hydride), $F^-$, $Cl^-$, $Br^-$, or $I^-$, a bivalent negative ion $O^{2-}$ or $S^{2-}$, and the like. Preferably, the operation temperature at which ions become movable is equal to or higher than 300K, and the concentration of movable ions in the solid electrolyte layer 16 at room temperature is equal to or less than the trap concentration of the amorphous semiconductor layer 13. Consequently, in the manufacturing process, after stacking the solid electrolyte layer 16 on the amorphous semiconductor layer 13, the movable ions are prevented from being excessively diffused to the amorphous semiconductor layer 13 by annealing process or the like to disturb a change in the conduction type of the amorphous semiconductor layer 13.

The electrodes 11 and 15 are made of a low-resistance metal such as aluminum (Al) or copper (Cu), and the electrode 14 is made of, for example, tungsten (W) or titanium nitride (TiN) to facilitate temperature rise in the amorphous semiconductor layer 13.

In the memory device 1 of the embodiment, when pulse voltage Vg (gate voltage) is applied to the electrode 11, movable ions move between the solid electrolyte layer 16 and the amorphous semiconductor layer 13. While forming an accumulation layer on the surface of the amorphous semiconductor layer 13, the conduction type of a partial region in the amorphous semiconductor layer 13 changes. By the change in the conduction type of the amorphous semiconductor layer 13, data is written/erased. In the following, the change in the conduction type in the amorphous semiconductor layer 13 will be described in detail.

The change in the conduction type of the amorphous semiconductor layer 13 is caused by the phase transition of the second kind which occurs between two distinguishable states of the amorphous state. First, the two states existing in the amorphous state will be described.

It is known that the chalcogenide semiconductor containing a chalcogen element (S, Se, Te) or an alloy of the chalcogen element exhibits two kinds of electric switching characteristics (P. G. Le Comber and J. Mort, "Electronic and Structural Properties of Amorphous Semiconductors", Academic press, 1973).

Figure 7:
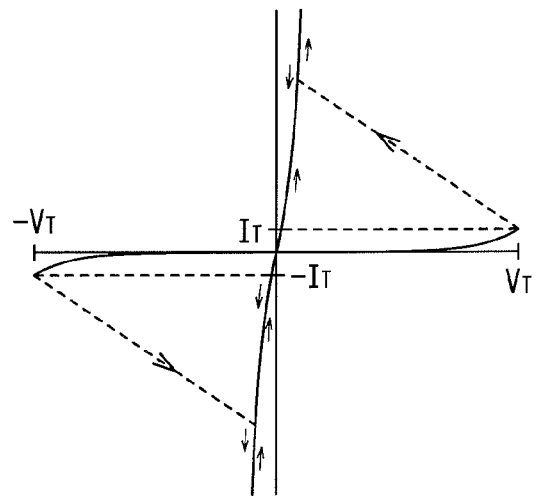
FIG. 7 is a characteristic diagram illustrating characteristics of memory switching.
Figure 8:
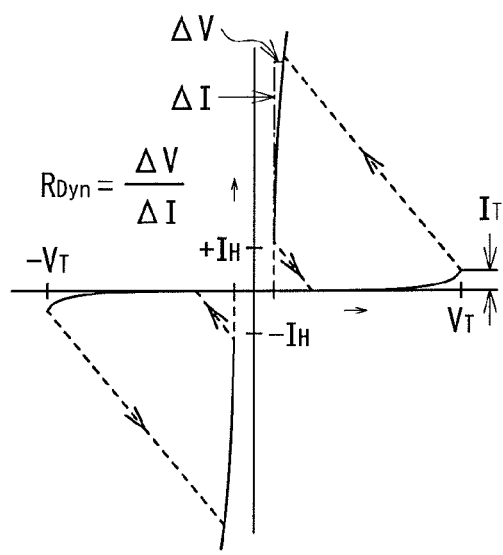
FIG. 8 is a characteristic diagram illustrating characteristics of threshold switching.

One of the characteristics is a voltage-current characteristic called "memory switching" illustrated in FIG. 7. $Ge_2Sb_2Te_5$, $Te_{81}Ge_{51}X_4$, or the like has a soft glass structure and, when application voltage exceeds a threshold voltage $V_{th}$, changes from the amorphous state to the crystal state in very short time. The voltage-current characteristic obtained at this time is "memory switching". On the other hand, $Te_{30}As_{30}Si_{10}Ge_{10}$ or the like has a hard tetrahedral structure, is not easily crystallized, and exhibits a switching phenomenon as illustrated in FIG. 8 in the amorphous state. This is another voltage-current characteristic called "threshold switching".

However, $Ge_2Sb_2Te_5$ which normally displays the memory switching also exhibits the threshold switching by sweeping an application voltage in time shorter than the crystallization time. Two amorphous states appearing in the threshold switching, that is, an amorphous state in high resistance and an amorphous state in low resistance relate to the present disclosure. Next, the mechanism that the amorphous state in high resistance and the amorphous state in low resistance appear will be described.

Figure 9:
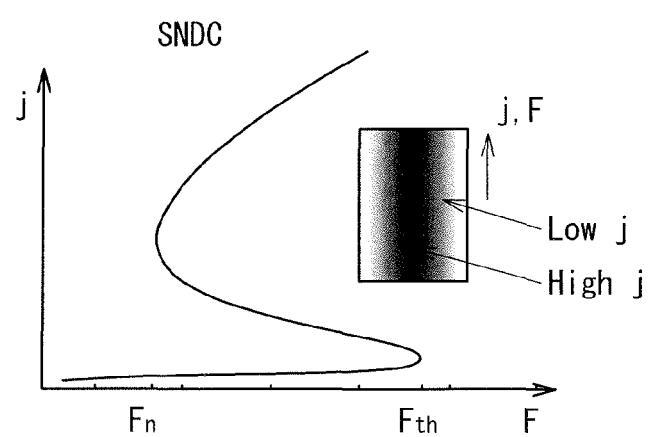
FIG. 9 is a characteristic diagram illustrating negative resistance in an S-shape type.

A sufficient Joule heat is necessary for crystallization of $Ge_2Sb_2Te_5$, and high current to generate the Joule heat is passed only in the amorphous state in low resistance. Since a voltage-current characteristic which is seen when the amorphous state in low resistance appears exhibits an S-shaped negative resistance as illustrated in FIG. 9, the current is called an "S-shaped negative current (SNDC)". The SNDC appearing mechanism relates to formation of a coarse/dense distribution of current density called filament and is caused by collisional ionization (E. Scholl, "Non-equilibrium Phase Transition in Semiconductors", Springer-Verlag, 1987). The collisional ionization refers to a phenomenon that carriers accelerated by electric field collide with a lattice and new carriers are created. A phenomenon such that repetition of the collisional ionization starts autocatalytic multiplication of the number of carriers and, finally, electric insulation is lost is called avalanche breakdown in semiconductor (Y. Okuto, "Threshold energy effect on avalanche breakdown voltage in semiconductor junction", Solid-state Electronics, 18, 161 (1975)).

In a chalcogenide semiconductor, a trap level created by a not-coordinated (dangling bond) lone electron pair in a chalcogen element relates to the collisional ionization. The amorphous state in low resistance is stable only when the electric field is applied and is therefore also called an ionization equilibrium state. Since the chalcogenide semiconductor has two stable amorphous states and the stable states are determined by the electric field, E. Scholl classifies the state transition between the amorphous states as a so-called phase transition of the second kind using the electric field as an order parameter. In this case, the phase transition of the second kind refers to a phenomenon that the second order differential (the following expression (3)) of Gibbs free energy G becomes discontinuous. In the expression (3), p denotes pressure of a system and T denotes absolute temperature of the system. All of the structural phase transition, magnetic phase transition, transition from a normal conducting state to a superconducting state, a superfluid state of liquid helium, and the like are the phase transition of the second kind which appears when the order parameter changes from an order state to a disorder state. Since the first order differential of the Gibbs free energy is continuous in the second or higher-order phase transition, latent heat is not generated, and a discontinuous point in specific volume is not also generated. In the present disclosure, the phase transition of the second kind is used as the principle of the resistance change in the memory device, so that release/absorption of the latent heat and a volume change as drawbacks of the memory device which writes/erases data by the phase transition of the first kind are unaccompanied, and a temperature rise exceeding the melting point of the chalcogenide semiconductor is also unnecessary. Next, the reason why the conduction type is changed by the phase transition of the second kind between the two amorphous states will be described.

$$\left(\frac{\partial^2 G}{\partial P^2}\right)_T \text{ OR } \left(\frac{\partial^2 G}{\partial T^2}\right)_P \quad (3)$$

When collisional ionization via the trap level occurs in the chalcogenide semiconductor, an original majority carrier (holes in most cases of the chalcogenide semiconductors) is trapped and cannot move in space. To satisfy an electroneutrality condition, only another carrier (electrons in most cases of chalcogenide semiconductors) generated by pair production by the collisional ionization can contribute to current. This is the mechanism of the change in the conduction type between the amorphous state in low resistance and the amorphous state in high resistance. In the case where the majority carrier is an electron, the semiconductor is classified as the n-type semiconductor. In the case where the majority carrier is a hole, the semiconductor is classified as the p-type semiconductor. It is known that, in most cases, the chalcogenide semiconductor is of the p type and, by stacking a silicon semiconductor of the n type, the threshold switching is provided with the diode characteristic (K. E. Petersen, "On state of amorphous threshold switches" J. Appl. Phys., 47, 256 (1976)). Since the amorphous state in high resistance changes to the p type and the amorphous state in low resistance changes to the n type, the diode characteristic appears in the threshold switching.

However, as described above, the amorphous state in low resistance exists stably only when the electric field is applied. When the electric field is set to be zero, the amorphous state returns to the amorphous state in high resistance. Consequently, the mechanism cannot be applied as it is to the memory device. The embodiment provides the following mechanism capable of maintaining the amorphous state in low resistance even when the electric field is set to zero.

Figure 3:
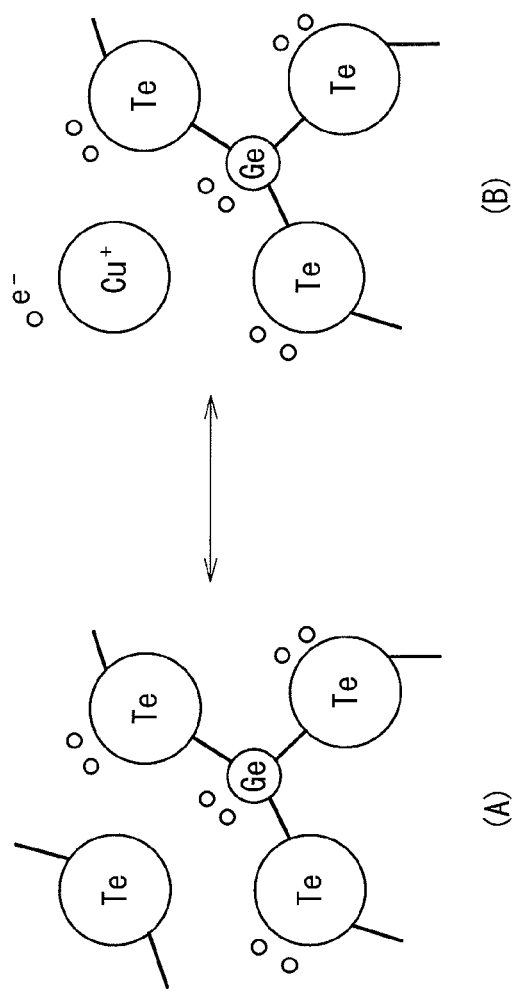
FIG. 3 is a schematic diagram illustrating states of an amorphous semiconductor layer before and after a phase transition of the second kind.

Since the viscosity of the amorphous semiconductor changes according to the composition and temperature, when ions are introduced by electric field acceleration while increasing the temperature of the amorphous semiconductor, a part of a glass network can be substituted with ions (R. Fairman and B. Ushkov, "Semiconducting Chalcogenide Glass", Elsevier Academic press, 2004). Such an ion implantation method is called substitutional doping. Even when avalanche breakdown does not occur, by the band bending of the inversion state or the strong inversion stage as described above, the amorphous state in low resistance is allowed to appear. In the memory device 1 of the embodiment, the amorphous semiconductor layer 13 is formed in contact with the solid electrolyte layer 16 containing movable ions, and the movable ions are introduced along the inversion region subjected to the band bending from the solid electrolyte layer 16 to the amorphous semiconductor layer 13. In other words, the concept of substitutional doping and band bending is used. (A) and (B) of FIG. 3 are schematic diagrams illustrating states of the amorphous semiconductor layer 13 before and after a phase transition of the second kind in the case where the amorphous semiconductor layer 13 is made of GeTe and positive ions are $Cu^{2+}$.

In the memory device 1 of the embodiment, when the pulse voltage Vg (gate voltage) is applied to the electrode 11, movable ions move between the solid electrolyte layer 16 and the amorphous semiconductor layer 13, while forming an accumulation layer on the surface of the amorphous semiconductor layer 13, the conduction type of a part of the amorphous semiconductor layer 13 changes. In other words, a pn junction is formed in the amorphous semiconductor layer 13, the state of resistance between the electrodes 14 and 15 changes, and data is written or erased. In the following, the amorphous state in high resistance (original conduction type) of the amorphous semiconductor layer 13 is defined as a reset state, the amorphous state in low resistance (opposite conduction type) of at least a part of the amorphous semiconductor layer 13 is defined as a set state, and the operation will be described concretely.

For example, the amorphous semiconductor layer 13 is made of a chalcogenide semiconductor of the p type. First, when the pulse voltage Vg is applied to the electrode 11, Joule heat is generated in the amorphous semiconductor layer 13, temperature rises, and movable ions are supplied by the electric field acceleration from the solid electrolyte layer 16 to the amorphous semiconductor layer 13. When the positive ions are implanted from the solid electrolyte layer 16 to the amorphous semiconductor layer 13 of the p type by the electric field acceleration, a part of a not-coordinated lone electron pair in the chalcogen element is used to trap the implanted positive ions, and the conduction type of at least a part of the amorphous semiconductor layer 13 changes to the n type. The movable ions are guided into the amorphous semiconductor layer 13 along the band-bent inversion region in the surface of the amorphous semiconductor layer 13, and a pn junction occurs in the amorphous semiconductor layer 13.

Figure 4:
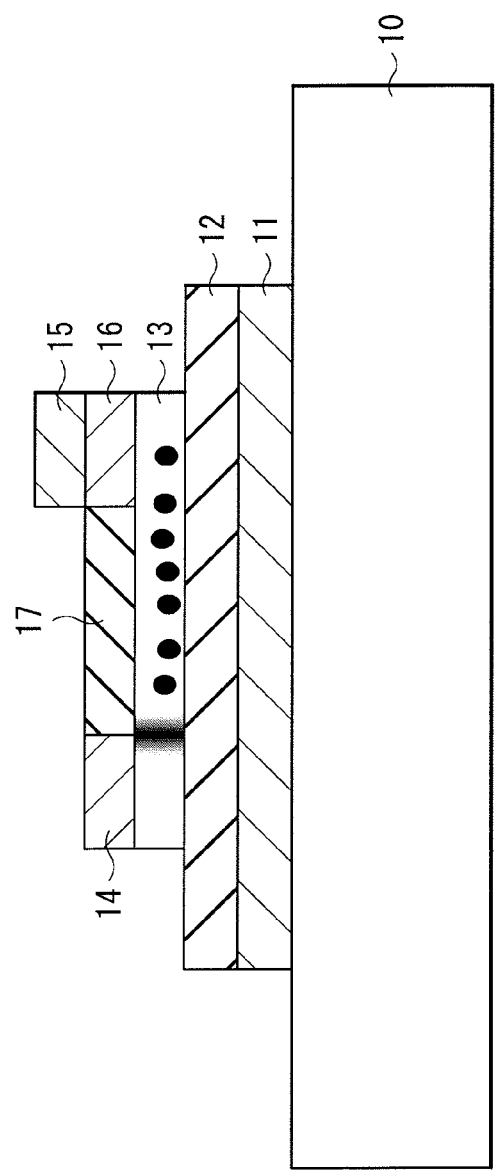
FIG. 4 is a conceptual diagram of a memory device in a set state.

FIG. 4 is a conceptual diagram of the memory device 1 in the set state. Since movement of the movable ions is accelerated by the voltage applied to the electrodes 14 and 15, by adjusting the magnitude and time of the voltage applied to the electrodes 14 and 15, the degree of drifting of the movable ions in the amorphous semiconductor layer 13 is controlled. In other words, the position of the pn junction formed in the amorphous semiconductor layer 13 is controlled, and the value of resistance between the electrodes 14 and 15 is arbitrarily adjusted, and multivalue information can be held. For example, by selecting four combinations of the magnitude and time of the voltage applied to the electrodes 14 and 15 so that the resistance state is expressed in four values, multivalue recording of two bits is performed. Sense current which flows when the voltage Vg is applied to the electrode 11 changes step by step only by the number of resistance states selected.

To make the phase transition of the second kind in which the conduction type changes as described above occur, first, when the amorphous semiconductor layer 13 is of the p type, the solid electrolyte layer 16 has to contain movable positive ions. When the amorphous semiconductor layer 13 is of the n type, the solid electrolyte layer 16 has to contain movable negative ions. Further, by the movement of the movable ions, the trap concentration in the amorphous semiconductor layer 13 has to become equal to or higher than donor concentration or acceptor concentration. An amorphous semiconductor containing a chalcogen element or an alloy of the chalcogen element has many not-coordinated lone electron pairs and has excellent property to trap atoms of a different kind, so that it is preferable for the amorphous semiconductor layer 13. For example, germanium telluride ($Ge_XTe_{100-X}$) may be used for the amorphous semiconductor layer 13. In this case, when atomic percent of Ge atoms in $Ge_XTe_{100-X}$ is X (at %), more preferably, X is in the range of 10 at % to 60 at % both inclusive.

For example, when $Ge_2Sb_2Te_5$ is used for the amorphous semiconductor layer 13, it is estimated that the trap concentration is $10^{21}$ cm$^{-3}$ and the donor concentration and acceptor concentration is about $10^{17}$ to $10^{19}$ cm$^{-3}$ (A. Pirovano, "Electronic Switching in PCM", Trans. Electron. Devices, 51, 452 (2004)). The concentration of positive ions introduced from the solid electrolyte layer 16 has to be equal to or higher than 0.01 to 1% of the trap concentration.

Figure 5:
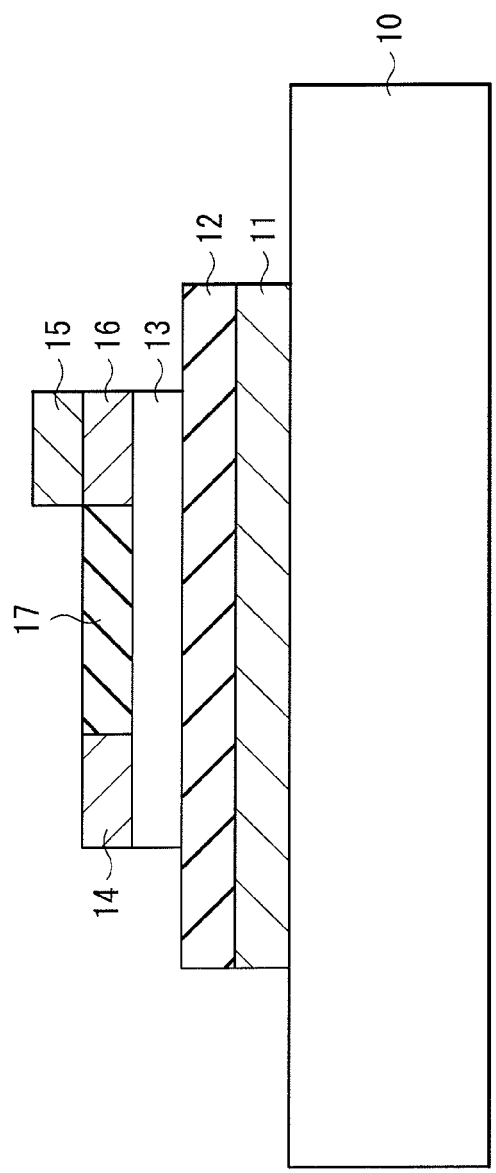
FIG. 5 is a conceptual diagram of a memory device in a reset state.

On the other hand, in the reset state, the not-coordinated lone electron pairs of the chalcogen element form a glass network or are used to trap holes as the major carrier. The conduction type of the amorphous semiconductor layer 13 is the p type as the original conduction type as illustrated in FIG. 5. In a state where movable ions are not introduced from the solid electrolyte layer 16 to the amorphous semiconductor layer 13, the resistance between the electrodes 14 and 15 is very high. Consequently, the amount of sense current which flows when the voltage Vg is applied to the electrode 11 is slight.

The amorphous semiconductor layer 13 is preferably made of a material which is not easily crystallized in order to prevent occurrence of the phase transition of the first kind before the phase transition of the second kind occurs or simultaneous occurrence of the phase transitions of the second and first kinds in the amorphous semiconductor layer 13. The phase transition of the second kind may be caused in time shorter than crystallization time necessary to cause the phase transition of the first kind in the amorphous semiconductor layer 13, or the phase transition of the first kind may be prevented by generating heat so that temperature rise stops at a temperature sufficiently lower than the crystallization temperature or the melting point.

A method of manufacturing the memory device 1 of the embodiment will be described below.

First, on the substrate 10 made of silicon or the like, the electrode 11 is formed by, for example, sputtering. After that, the insulating layer 12 made of silicon dioxide is formed by, for example, plasma CVD (Chemical Vapor Deposition). Subsequently, a $Ge_{20}Te_{80}$ film is formed as the amorphous semiconductor layer 13 by, for example, sputtering and is shaped in a predetermined shape by photolithography and etching. A silicon dioxide film is formed by sputtering and selectively etched to form the insulating layer 17. A $Zr_{20}Cu_{20}Al_{40}(GeTe)_{20}$ film is formed and selectively etched to form the solid electrolyte layer 16. After that, by vacuum deposition, sputtering, or CVD, the electrodes 14 and 15 are selectively formed. In such a manner, the memory device 1 illustrated in FIG. 1 is completed.

In the memory device 1 of the embodiment, when the pulse voltage is applied to the electrode 11 (gate electrode), movable ions move between the solid electrolyte layer 16 and the amorphous semiconductor layer 13, and the conduction type of at least a part of the amorphous semiconductor layer 13 changes. By the change, the resistance state between the electrodes 14 and 15 changes, and data is written or erased.

In the memory device 1 of the embodiment, by controlling the magnitude and application time of the voltage applied to the electrodes 14 and 15, the position of the pn junction formed in the amorphous semiconductor layer 13 is adjusted, and the resistance state (the value of resistance) between the electrodes 14 and 15 can be selected. In other words, multivalue recording is performed. Further, the change in the conduction type of the amorphous semiconductor layer 13 is caused by the phase transition of the second kind which does not accompany release/absorption of latent heat and volume change and does not need a temperature rise exceeding the melting point of the amorphous semiconductor. Therefore, power consumption is reduced, and reliability improves.

A modification of the embodiment will be described below.

(Modification)

Figure 6:
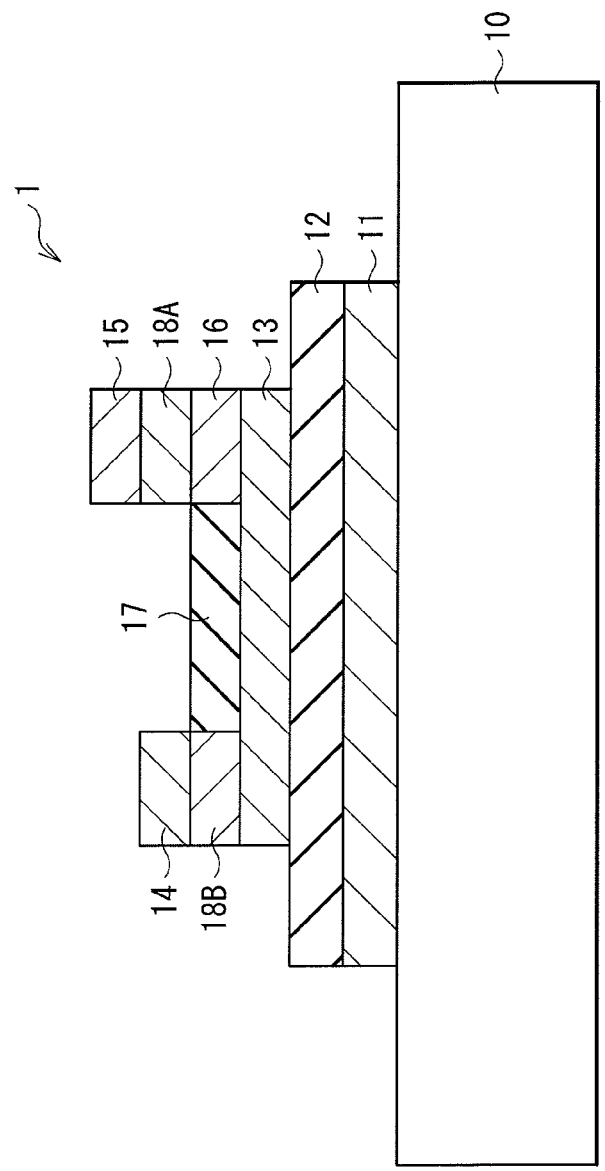
FIG. 6 is a cross section illustrating the configuration of a memory device as a modification.

As illustrated in FIG. 6, a heat barrier layer 18A each having a thickness of 2 nm or less may be provided between the solid electrolyte layer 16 and the electrode 15, and a heat barrier layer 18B having a thickness of 2 nm or less may be provided between the amorphous semiconductor layer 13 and the electrode 14. As the material of the heat barrier layers 18A and 18B, for example, titanium oxide ($Ti_2O_3$), alumina ($Al_2O_3$), silica ($SiO_2$), or the like may be used. When the movable ions are accelerated by the electric field while the temperature of the amorphous semiconductor layer 13 is increased, the time of the movement of the movable ions between the solid electrolyte layer 16 and the amorphous semiconductor layer 13 can be shortened. The heat barrier layers 18A and 18B function as thermal barrier layers and contribute to temperature rise in the amorphous semiconductor layer 13 and the solid electrolyte layer 16. On the other hand, since the thickness of the heat barrier layers 18A and 18B is 2 nm or less, there is no possibility that the electric influence is exerted on the memory device 1 by the tunnel effect.

Although the present disclosure has been described above by the embodiment and the modification, the disclosure is not limited to the embodiment and the like but may be variously modified. For example, the thin film transistor of the foregoing embodiment and the like is classified as an inverted staggered TFT but any of a staggered TFT, a coplanar TFT, an inverted coplanar TFT, and the like may be used.

Although the solid electrolyte layer 16 is provided on the side of the electrode 15 in the embodiment and the like, since the position of the solid electrolyte layer 16 is determined by the polarity of the voltage applied to the electrodes 14 and 15, it may be provided on the side of any of the electrodes 14 and 15.

Further, the materials of the layers, the film forming method, the film forming conditions, and the like described in the foregoing embodiment and modification are not limited. Other materials and other film forming methods may be also employed. For example, when the trap concentration is made exceed the donor concentration or the acceptor concentration by movement of movable ions, an oxide semiconductor or a nitride semiconductor may be used for the amorphous semiconductor layer 13. For example, although the configuration of the memory device 1 has been concretely described in the embodiment and the modification, another layer may be also provided.

The present disclosure contains subject matter related to that disclosed in Japanese Priority Patent Application JP 2010-180490 filed in the Japanese Patent Office on Aug. 11, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
a first electrode;
a first insulating layer stacked on the first electrode;
an amorphous semiconductor layer of a first conduction type stacked on the first insulating layer;
a solid electrolyte layer containing movable ions stacked on and in contact with a part of one face of the amorphous semiconductor layer;
a second electrode stacked on and electrically connected to the amorphous semiconductor layer via the solid electrolyte layer;
a third electrode stacked on and electrically connected to another part of the one face of the amorphous semiconductor layer;
a second insulating layer stacked on the one face of the amorphous semiconductor layer and between the second and third electrodes; and
wherein,
at the time of application of voltage to the third electrode, at least a part of the amorphous semiconductor layer reversibly changes to a second conduction type.

2. The memory device according to claim 1, wherein at the time of application of voltage to the first electrode, an accumulation layer is formed on the amorphous semiconductor layer and, by movement of movable ions from the solid electrolyte layer to the amorphous semiconductor layer, the conduction type of the amorphous semiconductor layer changes.

3. The memory device according to claim 1, wherein magnitude of a resistance value between the second and third electrodes can be controlled by adjusting magnitude and time of voltage applied across the second and third electrodes.

4. The memory device according to claim 3, wherein at least one bit can be stored by controlling the magnitude of the resistance value.

5. The memory device according to claim 1, wherein trap concentration in the amorphous semiconductor layer is equal to or higher than a donor concentration or an acceptor concentration.

6. The memory device according to claim 1, wherein:
A temperature at which the movable ions contained in the solid electrolyte layer become movable is 300 degrees Kelvin or higher, and
a concentration of the movable ions in the solid electrolyte layer at 300 degrees Kelvin is equal to or less than a trap concentration of the amorphous semiconductor layer.

7. A memory device comprising:
an amorphous semiconductor layer of a first conduction type;
a solid electrolyte layer containing movable ions and provided in contact with a part of one face of the amorphous semiconductor layer;
a first electrode electrically connected to the amorphous semiconductor layer via the solid electrolyte layer;
a second electrode electrically connected to the one face of the amorphous semiconductor layer;
a heat barrier layer provided between the first electrode and the solid electrolyte layer, between the second electrode and the amorphous semiconductor layer, or both; and
a third electrode provided over another face of the amorphous semiconductor layer with an insulating layer therebetween,
wherein,
at the time of application of voltage to the third electrode, at least a part of the amorphous semiconductor layer reversibly changes to a second conduction type.

8. A memory device comprising:
an amorphous semiconductor layer of a first conduction type;
a solid electrolyte layer containing movable ions and provided in contact with a part of one face of the amorphous semiconductor layer;
a first electrode electrically connected to the amorphous semiconductor layer via the solid electrolyte layer;
a second electrode electrically connected to the one face of the amorphous semiconductor layer; and
a third electrode provided over another face of the amorphous semiconductor layer with an insulating layer therebetween,
wherein,
at the time of application of voltage to the third electrode, at least a part of the amorphous semiconductor layer reversibly changes to a second conduction type, and
the amorphous semiconductor layer contains a chalcogen element (S, Se, Te) or an alloy of the chalcogen element.

9. A memory device comprising:
an amorphous semiconductor layer of a first conduction type;
a solid electrolyte layer containing movable ions and provided in contact with a part of one face of the amorphous semiconductor layer;
a first electrode electrically connected to the amorphous semiconductor layer via the solid electrolyte layer;
a second electrode electrically connected to the one face of the amorphous semiconductor layer; and
a third electrode provided over another face of the amorphous semiconductor layer with an insulating layer therebetween,
wherein,
at the time of application of voltage to the third electrode, at least a part of the amorphous semiconductor layer reversibly changes to a second conduction type, and
the amorphous semiconductor layer is made of $Ge_X Te_{100-X}$ ($10 \leq X \leq 60$).

10. The memory device of claim 1, further comprising a heat barrier layer between the second electrode and the solid electrolyte layer, between the third electrode and the amorphous semiconductor layer, or both.

* * * * *